United States Patent [19]
Roustaei

[11] Patent Number: 5,354,977
[45] Date of Patent: Oct. 11, 1994

[54] OPTICAL SCANNING HEAD

[76] Inventor: Alex Roustaei, 1696 Via Inspirar, San Marcos, Calif. 92069

[21] Appl. No.: 965,991

[22] Filed: Oct. 23, 1992

Related U.S. Application Data

[63] Continuation-in-part of Ser. No. 956,646, Oct. 2, 1992, which is a continuation-in-part of Ser. No. 843,266, Feb. 27, 1992, Pat. No. 5,291,009.

[51] Int. Cl.⁵ .............................................. G06K 7/10
[52] U.S. Cl. ..................................... 235/472; 235/462
[58] Field of Search ................. 235/462, 472; 250/553

[56] References Cited

U.S. PATENT DOCUMENTS

| | | | |
|---|---|---|---|
| 3,819,938 | 6/1974 | Kornrumpf et al. | 250/553 |
| 3,876,900 | 4/1975 | Amatsuka et al. | 250/553 |
| 4,115,703 | 9/1978 | Dobras | 250/568 |
| 4,542,528 | 9/1985 | Sanner et al. | 382/62 |
| 4,570,057 | 2/1986 | Chadima et al. | 235/472 |
| 4,578,571 | 3/1986 | Williams | 235/472 |
| 4,647,766 | 3/1987 | Dimur et al. | 250/227 |
| 4,804,949 | 2/1989 | Faulkerson | 340/710 |
| 4,818,847 | 4/1989 | Hara et al. | 235/472 |
| 4,841,132 | 6/1989 | Kajitani et al. | 235/472 |
| 4,900,907 | 2/1990 | Matusima et al. | 235/472 |
| 5,010,241 | 4/1991 | Butterworth | 235/462 |
| 5,073,954 | 12/1991 | Van Tyne et al. | 235/463 |
| 5,135,160 | 8/1992 | Tasaki | 235/462 |
| 5,196,684 | 3/1993 | Lum et al. | 235/462 |

FOREIGN PATENT DOCUMENTS

| 34681 | 2/1986 | Japan | 235/462 |
|---|---|---|---|

OTHER PUBLICATIONS

Data Sheet: CCD Bar Code Scanner; ZB-1000/2000 Plus Series, Zebex Industries, Inc., 1992 Zebex Catalog No. 920802.
Data Sheet: CCD Bar Code Handy Scanner Model BHS-6000 Series; Nippondenso Co., Ltd., Mar. 1992.
Advertisement: "Get a Head with Denso's Reading Edge Technology". ID Systems, Apr. 1987, vol. 7, No. 3.
"Information Encoding With Two-Dimensional Bar Codes", Theo Pavlidis, et al., Computer, vol. 25, No. 6, Jun. 1992, pp. 18–28.

*Primary Examiner*—John Shepperd
*Attorney, Agent, or Firm*—Brown, Martin, Haller & McClain

[57] ABSTRACT

The optical scanning head for scanning one- and two-dimensional bar codes includes at least one combination of light emitting diodes arranged so the LEDs emit light at different angles to create a fan of light. The combination and arrangement of the LEDs depends on whether one- or two-dimensional bar codes are to be read. A cylindrical lens optimizes the light impinging upon the bar code. An optical module includes a light shield or "dark room" and a lens/filter assembly which focusses reflected light on the detector, made up of a CCD module for detecting the light intensity in the reflected beam over a field of view across a bar code symbol. One or more combinations of linear CCD arrays in the CCD module generate an electrical signal indicative of the detected light intensity. A trigger mechanism allows selection of the number of LEDs or linear CCD arrays to efficiently scan one- or two-dimensional bar codes, where two-dimensional bar codes require more illumination for accurate scanning.

97 Claims, 10 Drawing Sheets

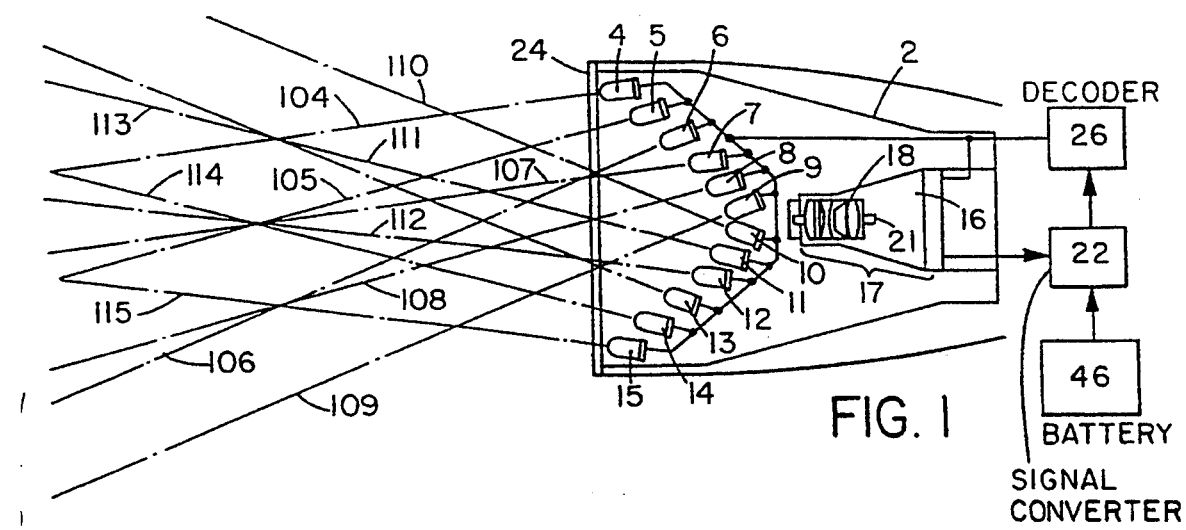
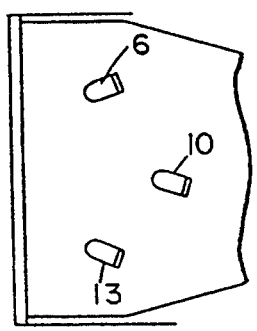
FIG. 2A
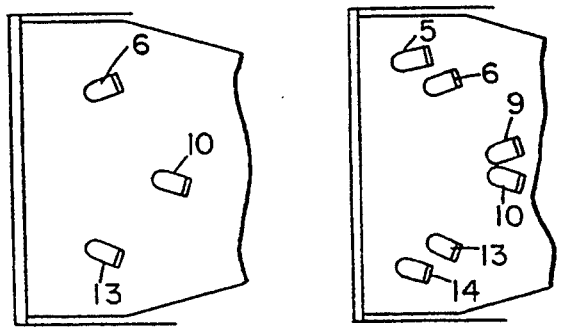
FIG. 2B
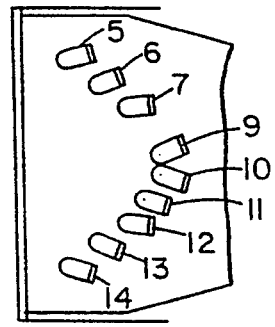
FIG. 2C
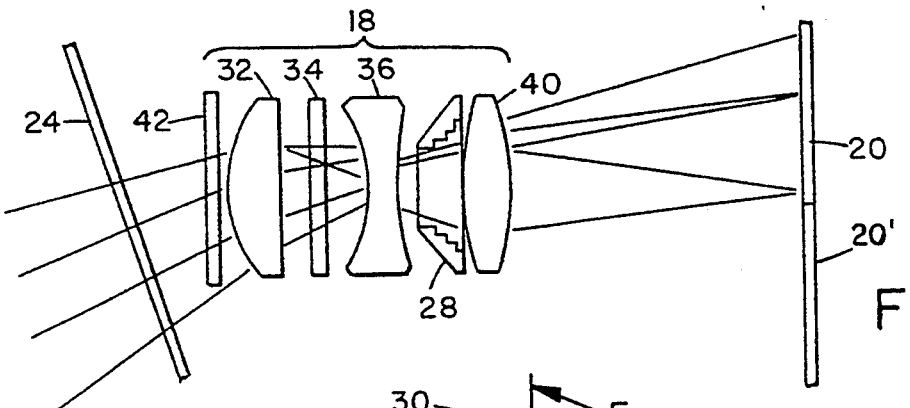
FIG. 3
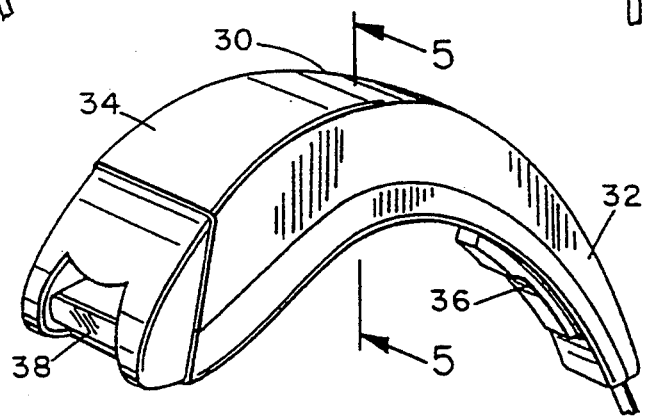
FIG. 4

TRIGGER

FIG. 7A

OF LEDs

ANALOG RESET ON CCD

TIME (MILLISECONDS)

OPTICAL SCANNING HEAD

This is a continuation-in-part of application Ser. No. 07/956,646; filed Oct. 2, 1992, which is a continuation-in-part of application Ser. No. 07/843,266, filed Feb. 27, 1992, now U.S. Pat. No. 5,291,009.

FIELD OF THE INVENTION

The invention generally relates to a scanning system for reading and/or analyzing bar code symbols and more particularly, to a portable bar code scanner.

BACKGROUND OF THE INVENTION

Many industries, including the assembly processing, grocery and food processing industries, utilize an identification system in which the products are marked with a bar code symbol consisting of a series of lines and spaces of varying widths. A number of different bar code readers and laser scanning systems have been developed to decode the symbol pattern to a multiple digit representation for inventory, production tracking, and for check out or sales purposes. Optical scanners are available in a variety of configurations, some of which are built into a fixed scanning station and others of which are portable. The portability of an optical scanning head provides a number of advantages, including the ability to inventory products on shelves and to track portable items such as files or small equipment. A number of these portable scanning heads incorporate laser diodes which permit the user to scan the bar code symbols at variable distances from the surface on which the bar code is imprinted. A disadvantage of laser scanners is that they are expensive to manufacture.

Another type of bar code scanner which can be incorporated into a portable system uses light emitting diodes (LED) as a light source and charge couple devices (CCD) as detectors. This class of bar code scanners is generally known as "CCD scanners". While CCD scanners have the advantage of being less expensive to manufacture, they limit the user to scanning the bar code by either contacting the surface on which the bar code is imprinted or maintaining a distance of no more than one and one-half inches away from the bar code, which creates a further limitation in that it cannot read a bar code any longer than the window or housing width of the scanning head. Thus, the CCD scanner does not provide the comfort or versatility of the laser scanner which permits variable distance scanning of bar code symbols which may be wider than the window or housing width.

Recently, considerable attention has been directed toward two-dimensional bar codes, which can store about 100 times more information in the same space occupied by a one-dimensional bar code. In two-dimensional bar coding, rows of lines and spaces are stacked upon each other. The codes are read by scanning a laser across each row in succession in a zig-zag pattern. This scanning technique introduces the risk of loss of vertical synchrony. It also has the disadvantage of requiring a laser for illumination of the bar code, which makes the scanner more expensive.

SUMMARY OF THE INVENTION

It is an advantage of the present invention to provide an optical scanning head for reading bar code symbols at variable distances from the symbol which uses LED light sources and CCD detectors.

In an exemplary embodiment, the optical scanning head comprises a plurality of light emitting diodes arranged in close proximity to each other with each of the LEDs being oriented to emit light at different angles so that a fan of light is created. Generally, LEDs are also oriented so that all LEDs are directed at some non-zero angle from a line perpendicular to the window through which the light is emitted. The number of LEDs can be varied depending on the intensity of light desired and the application. For example, a scan of a two-dimensional bar code will require more LEDs, generally in a double light arrangement, while a one-dimensional bar code needs only one row. A single scanning head can be made with the ability to select one- or two-dimensional scanning by including a trigger or other switching means which activates the appropriate number of LEDs. The LEDs can be arranged in a number of different groupings, such as in "V"- or "U"-shape, or in single or parallel lines. In an alternative embodiment, the LED array can be replaced with a flash lamp, which provides more intense light for scanning at greater distances.

An optical module includes a light shield or "dark room" and a lens/filter assembly which provides control of the depth of focus of the scanner. The optical module is located behind the light source, and the detector, made up of a CCD array is mounted behind the optic module for detecting the light intensity in the reflected beam over a field of view across a bar code symbol. The CCD array may consist of a single linear arrangement, a double linear arrangement, or a matrix arrangement. The CCD array generates an electrical signal indicative of the detected light intensity. This signal is conveyed to a signal converter consisting of an analog filter and analog-to-digital conversion circuitry to filter noise and digitize the analog signal to generate data descriptive of the bar code symbol. Gain control, which may or may not be automatic, edge detection or highly adaptive thresholding is provided to adjust the magnitude of the received signal to a pre-determined level, regardless of the distance between the bar code and the scanner and the ambient illumination. Each of these techniques look, in effect, at the slope of the waveform produced when a bar code is scanned (while the ideal signal would be a set of rectangular pulses, the real signal has a rounded form because of the convolution distortion).

A light transmissive window is positioned in front of the LEDs for manipulating and focussing the light. The window may include a filter and/or anti-reflection coating. The window may be configured to have a double radius for focussing at two different focal distances, and may be "knurled" or scalloped to homogenize the light. For optimum efficiency, the window is located at a distance in front of the LEDs coinciding with the greatest concentration of light.

The optical scanning head is powered by a D.C. source or battery, preferably rechargeable, which provides DC voltage to the LEDs and CCDs in response to a clocked signal which is provided by a drive clock sequencer and synchronization module. The timing signal can control a gradual, serial illumination of the LEDs and coordinates the activation of the CCDs in order to minimize power consumption during scans. Alternatively, the voltage supplied to the LEDs can be modulated in response to the level of the signal produced by the CCDs. If a bar code is scanned at close range, a lower level of light will provide a strong signal.

However, at greater distances from the bar code, higher light intensity is necessary to achieve a good quality signal at the CCDs. Power is conserved in the latter version by not providing full power to the LEDs unless necessary.

The timing signal may also be used to control an optional electronic shutter which periodically closes to create "snapshots" of the bar code. This preserves the integrity of the bar code pattern signal while the scanner or the bar code is in motion.

BRIEF DESCRIPTION OF THE DRAWINGS

Understanding of the present invention will be facilitated by consideration of the following detailed description of a preferred embodiment of the present invention, taken in conjunction with the accompanying drawings, in which like reference numerals refer to like parts and in which:

FIG. 1 is a diagrammatic view of the relative layout of the LEDs, optical module, and detector on a printed circuit board;

FIGS. 2a, 2b and 2c are diagrammatic views of relative locations of LEDs for one trio, two trios and three trios of LEDs, respectively;

FIG. 3 is an exploded view of the lens assembly;

FIG. 4 is a perspective view of an assembled optical scanning head including a housing;

FIGS. 7a through 7g are plots of clock pulses for different timing configurations with respect to activation of the scanner (FIG. 7a); alternate illumination cycles (FIGS. 7b, 7c and 7d) according to the present invention; analog reset of the detector (FIG. 7e); and illumination patterns according to prior art methods 1 and 2 (FIGS. 7f and 7g);

FIG. 18c shows a two-tiered arrangement of the LEDs, FIG. 18d shows two vertical rows of LEDs, FIG. 18e and 18f show a combination horizontal and vertical arrangements;

FIG. 19 is a diagrammatic view of a single light source with a parabolic reflector;

DETAILED DESCRIPTION OF THE PREFERRED EMBODIMENT

Figure 5:
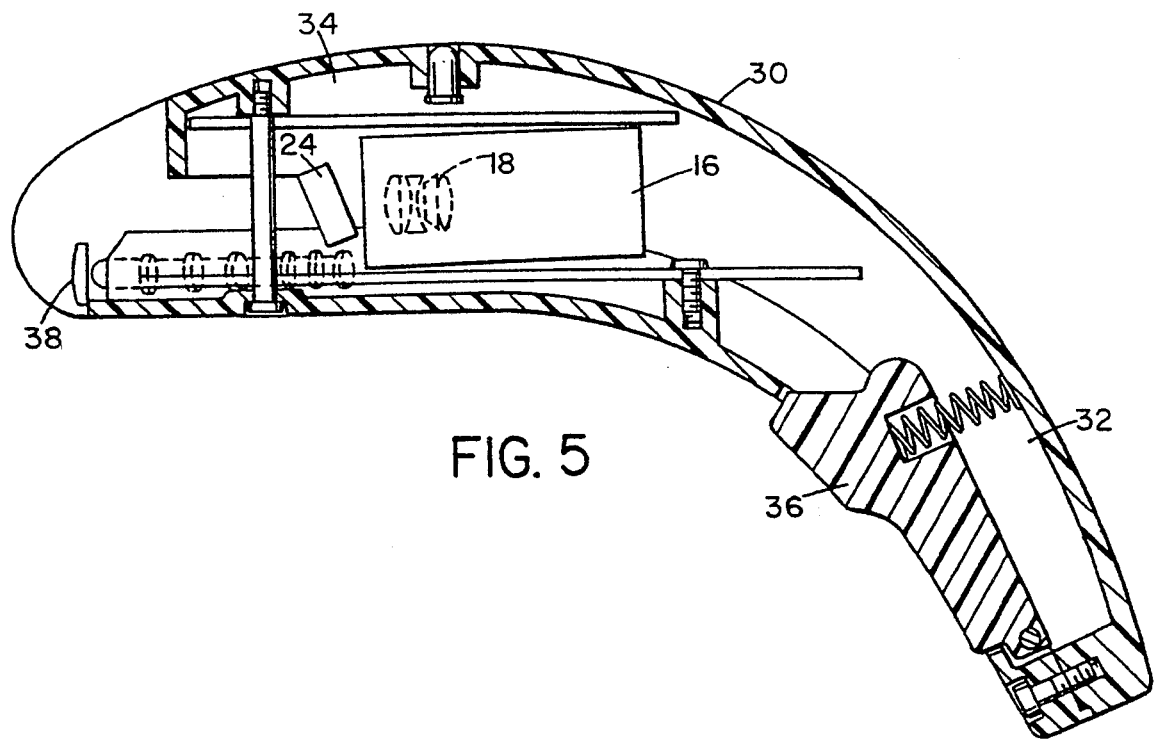
FIG. 5 is a cross-sectional view along line 5—5 of FIG. 4.

The scanning head module illustrated in FIG. 1 comprises the printed circuit board (PCB) 2 configured as a generally "U"- or "Y"-shaped surface onto which is mounted a plurality of LEDs (from 3 to 24 individual LEDs) configured in a "V"-shaped, "U"-shaped, or linear pattern in an orientation that results in projection of a light ray by one LED in a direction distinct from other LEDs in the trio. The configuration illustrated in FIG. 1 has 12 LEDs mounted on the PCB 2 in a "V"-shape. These are identified as LEDs 4 through 15, which emanate rays of light 104 through 115. The portion of printed circuit board 2 from which LED light emanates will be considered the front of the board. A line of reference for describing the orientation angles of the LEDs runs perpendicular to the front of the PCB 2. At the approximate center of board, behind the LEDs, an optical module 17 consisting of a light shield (dark room 16), in which is contained lens assembly 18 which filters and focuses light reflected from a scanned bar code onto CCD detector 20, disposed behind the optical module at the rear of PCB 2. A signal generated by activation of the CCDs by the reflected light is conveyed to signal converter 22, for the one-dimensional scanner, which consists of an analog filter and an analog-to-digital circuit, or by signal converter 22' for the two-dimensional scanner. Forward of the LEDs, either attached to the PCB 2 or mounted within a housing containing PCB 2, is window 24 which is light transmissive and provides filtering, focusing and positioning of the light path of the illuminating beam incident upon the bar code to be scanned. The reflected light carrying the intensity modulated bar code signal is directed back to the lens assembly and to the detector.

The scanning head may also include a decoder module 26 which decodes a multiple-digit representation of bar code symbols such as UPC, EAN, JAN, Code 39, Code 2/5I, Code 2/5, Code 128, Codabar, Plessey, and other bar code systems. In the two-dimensional bar code reader, a memory buffer 88, shown in FIG. 12, will store the two-dimensional image prior to decoding by decoder module 26.

The first embodiment of the light source illustrated in FIG. 1 consists of 12 LEDs which are mounted in a generally V-shaped configuration relative to other LEDs so that they point outward at angles such that groupings of three on a single leg, e.g. LEDs 4, 5 and 6 or 13, 14 and 15 form substantially a single beam of light which expands at increased field depth. The actual grouping of the LEDs is best illustrated in FIGS. 2a, b and c. Here, the 12 LEDs are divided into groups of three, or trios, of LEDs. From this it can be seen that a given trio of LEDs is not determined by serial progression of the LED's location in the V-configuration, but rather that the combined illumination of the trio substantially fills the window 24 and expands therefrom to form a fan of light to facilitate detection of bar codes which are wider than the window itself.

In FIG. 2a, LEDs 6, 10 and 13 make up the first trio. Light rays 106, 110 and 113, shown in FIG. 1, fill a substantial portion of the window 24. The second trio of LEDs comprises LED 5, LED 10 and LED 14, which are added to the first trio, as shown in FIG. 2b. The beams emanating therefrom, rays 105, 110 and 114, shown in FIG. 1, supplement rays from the first trio to fill window 24 and expand therefrom. FIG. 2c illustrates the location of the third trio consisting of LEDs 7, 11 and 12. Rays 107, 111 and 112 emanate therefrom to supplement the light from the first two trios. The fourth trio is made up of LEDs 4, 8 and 15 with their respective rays 104, 108 and 115. The specific LEDs included within a given trio are variable as long as the resultant fan of light substantially fills the window 24. As will be described below, the designated grouping of LEDs, whether in a trio or some other number greater than 2, may be sequentially illuminated in order to conserve the energy of the power source. For example, the configuration having twelve LEDs can also be divided into two sextets or three quartets. Similarly, if 24 LEDs are used, the groupings can consist of three, four, six, eight, or twelve LEDs. The grouping of the LEDs is significant when sequential or graduated illumination is used.

Figure 11:
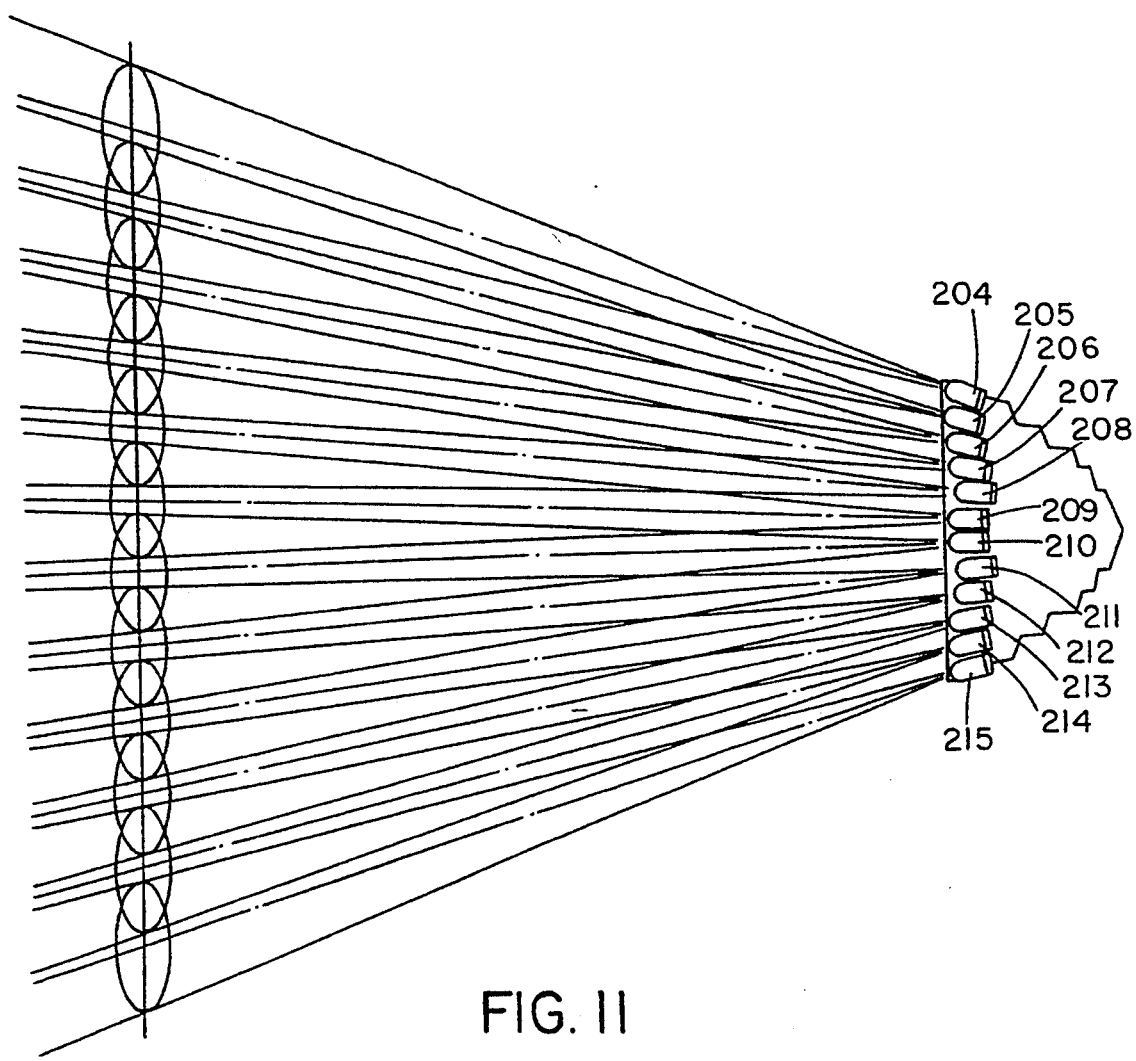
FIG. 11 is a diagrammatic view of a third alternate LED layout and its corresponding light distribution.
Figure 18A:
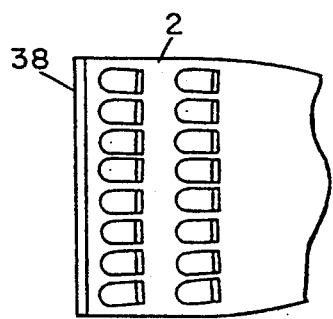
FIGS. 18a through 18f are diagrammatic front elevational of LED orientation for two-dimensional scanning, FIG. 18a showing parallel, and FIG. 18b perpendicular, to the front of the printed circuit board.
Figure 18B:
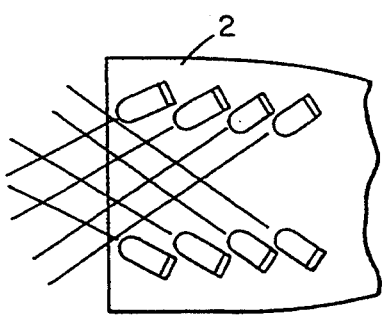
Figure 18C:
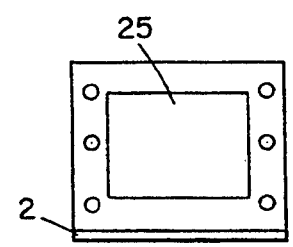
Figure 28:
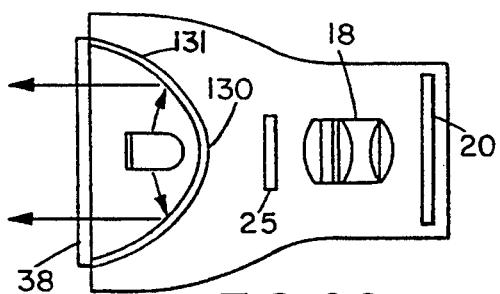
Figure 18E:
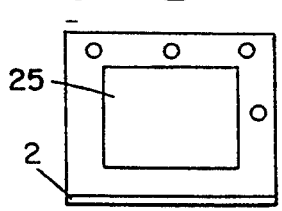
Figure 18D:
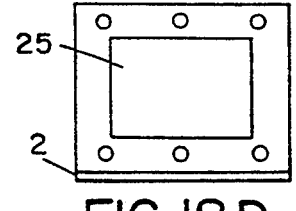
Figure 18F:
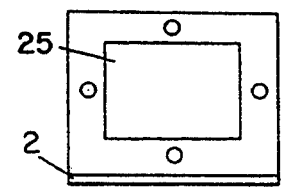
Figure 20A:
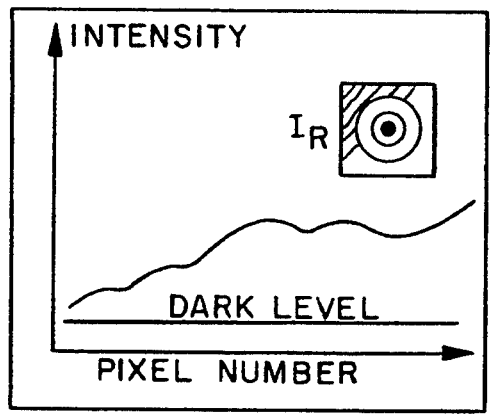
FIGS. 20a and 20d are plots of intensity with pixel number for an actual image (20a), a dark frame (20b), a flat field (20c) and a corrected image (20d)
Figure 20B:
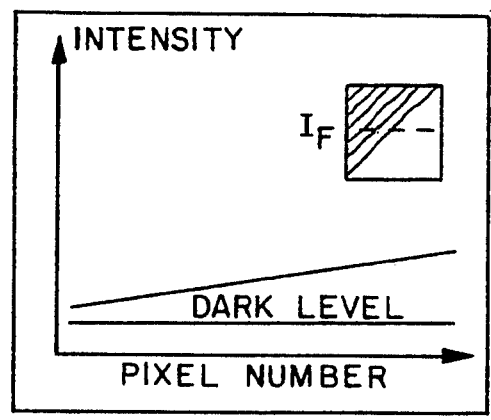
Figure 20C:
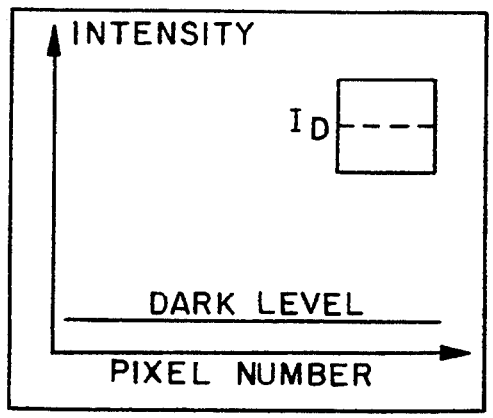
Figure 20D:
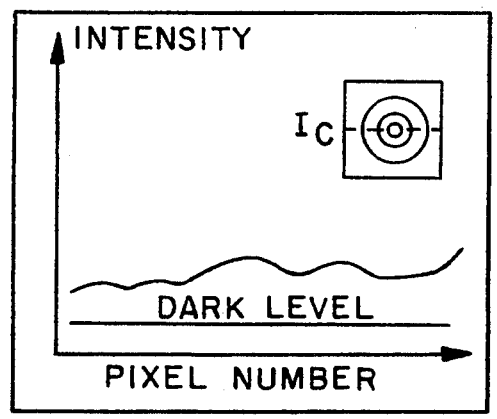

Alternate configurations for arrangement of the LEDs can be a "U"-shape or a generally straight line across the front of the board, as illustrated in FIG. 11. For two-dimensional bar code scanning, the variations can include two linear rows of LEDs, parallel to the front of the PCB 2, or two linear rows of LEDs perpendicular to the front of the board, as illustrated in FIGS. 18a and 18b, respectively which shows a view of the scanner looking backward from the front of PCB 2. These figures, along with FIGS. 18c–18f, show the relative positions of LEDs arranged in a vertical plane extending upward from and perpendicular to PCB 2. Centered within this vertical plane is window 24 through which reflected light is transmitted to the lens assembly and detector. Combinations of parallel and perpendicular rows may also be used. A multi-tiered arrangement can also be used for positioning of the LEDs, with, for example, one row above another, as in FIG. 18a, or with two vertical rows extending upward from PCB 2, as in FIG. 18c, or any combination thereof. In FIG. 18e, a possible combination consists of one row of LEDs running across the upper row, and a single LED on one side, and in FIG. 18f, a single LED is located on each of four sides in a vertical plane. In each case, the fan of light is created by orienting the LEDs at different angles. In the straight line configuration of FIG. 11, the centermost LEDs 209 and 210, are turned to point away at an angle of 1.625 degrees from a line normal to the front of the board. Progressing outward, each LED is 3.25 degrees from its inner adjacent LED.

The LEDs are selected so that they emit light at the wavelength of 660 nanometer, red light within the visible spectrum. This wavelength provides optimal contrast for bar code scanning applications in which dark and light bars must be distinguished. Infrared light also provides enhanced contrast, so that LEDs emitting light outside of the visible spectrum may be used.

An alternate light source is a flash lamp 130 or any other intense light source, illustrated in FIG. 19. Flash lamps are available to emit light at a number of different wavelengths. The wavelength at which the selected flash lamp emits light will be determined by the color of the bar code and its background, so that the best possible contrast is obtained. A parabolic reflector 132 is included within the optical scanning head assembly with the flash lamp 130 at its center. This allows the maximum amount of light to be directed forward for illumination of the bar code. The higher intensity light will permit scanning at distances greater than 35 inches.

The optic module 17 consists of three lenses mounted inside a slidable lens support 21, all of which are retained within dark room 16. The selection of the three lenses of which the lens assembly 18 is formed depends upon the desired reference plane, i.e., the desired depth of field, which is the distance between the detector 20 and the bar code being scanned, so the reflected light is appropriately focused on the detector array. The lens assembly 18, shown in detail in FIG. 3, consists of a plano-convex lens 32 followed by a bandpass filter 34, a biconcave lens 36 followed by an optical diffuser 28 and a focussing and receiving singlet lens 40. Lens 40 is important to the success of the invention since it determines the beam diameter impinging upon the detector array, and concentrates the beam to provide the maximum available light at the detector. In a two-dimensional scanner, the image is focussed on the detector array, shown here as two parallel linear CCD arrays 20 and 20', without distortion, by a plano-convex lens instead of the focussing singlet. The lenses may be coated with an anti-reflection coating and/or a pass-band coating to minimize reflectance at the interfaces between the adjacent lenses and at the ends of the lens assembly.

The optimum depth of field can be adjusted by moving the lens assembly forward or backward in its slidable mounting 21 with respect to the detector. This will modify the focal point on the detector so that it can be fine tuned for a desired scanning height.

Figure 13A:
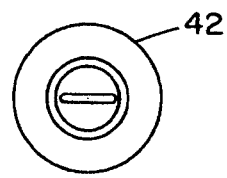
FIG. 13a and 13b are front views of air slits for one-dimensional and two-dimensional applications, respectively.
Figure 13B:
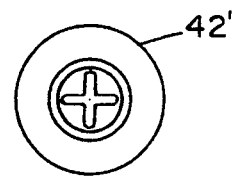

A spatial filter may be included within the optical module, disposed adjacent to or even integral with the lens assembly 18. The spatial filter 42 is an air slit with an orientation and configuration corresponding to the shape of the bar code being scanned. For a one-dimensional bar code, a single slit, illustrated in FIG. 13a, is used. The slit is oriented horizontally so that it is parallel to the direction in which the bar code is scanned. For two-dimensional bar codes, a crossed slit pattern is used to provide a two-dimensional spatial filter 42', as shown in FIG. 13b. The spatial filter 42 or 42' may be positioned on front of or behind lens 32. The spatial filter 42 or 42' and the bandpass filter 34 may also be formed as a unit, with the slit pattern formed directly on filter 34. Spatial filter 42' may also be used for one-dimensional bar code applications. The horizontal and vertical slits may each have the same dimensions as the single slit, or the dimensions of the vertical and horizontal slits may differ from each other. The light absorber/diffuser 28 is in the form of a funnel having an aperture with its wider end facing towards the detector end of the lens assembly. The funnel allows absorption and concentration of light diffracted from the edges of the lenses. The bandpass filter 34 serves to block any radiation which falls outside of a wavelength range centered around 660 nm (or wavelengths surrounding infrared light for the infrared scanner). For the visible light system, it is particularly desirable to filter the infrared and other visible portions of the light spectrum which may reach the window from the sensing region to provide optimal contrast. This improves resolution of bar codes read at a distance shorter than the depth of field.

The window 24 has a generally "Z"-shaped profile, one leg of which extends in front of the optical assembly 18 and holds or consists of a bandpass filter 25 centered at approximately 660 nm (for the visible light scanner)

and a light equalizer/diffuser, and the other leg which holds a cylindrical lens 38, which focuses the light along one axis to form a plane of light, with a line of light being created at its focal point. When the bar code is scanned at the precise focal point of the cylindrical lens 38, the maximum possible light will be reflected to the detector. The function of the window's components is to suppress radiation noise from the LEDs, to form a homogeneous incident beam for illumination of the bar code, to collimate the beam, and to filter the reflected light by removing extraneous light which falls outside of the predetermined acceptable bandwidth range of 660 nm.

Figure 9:
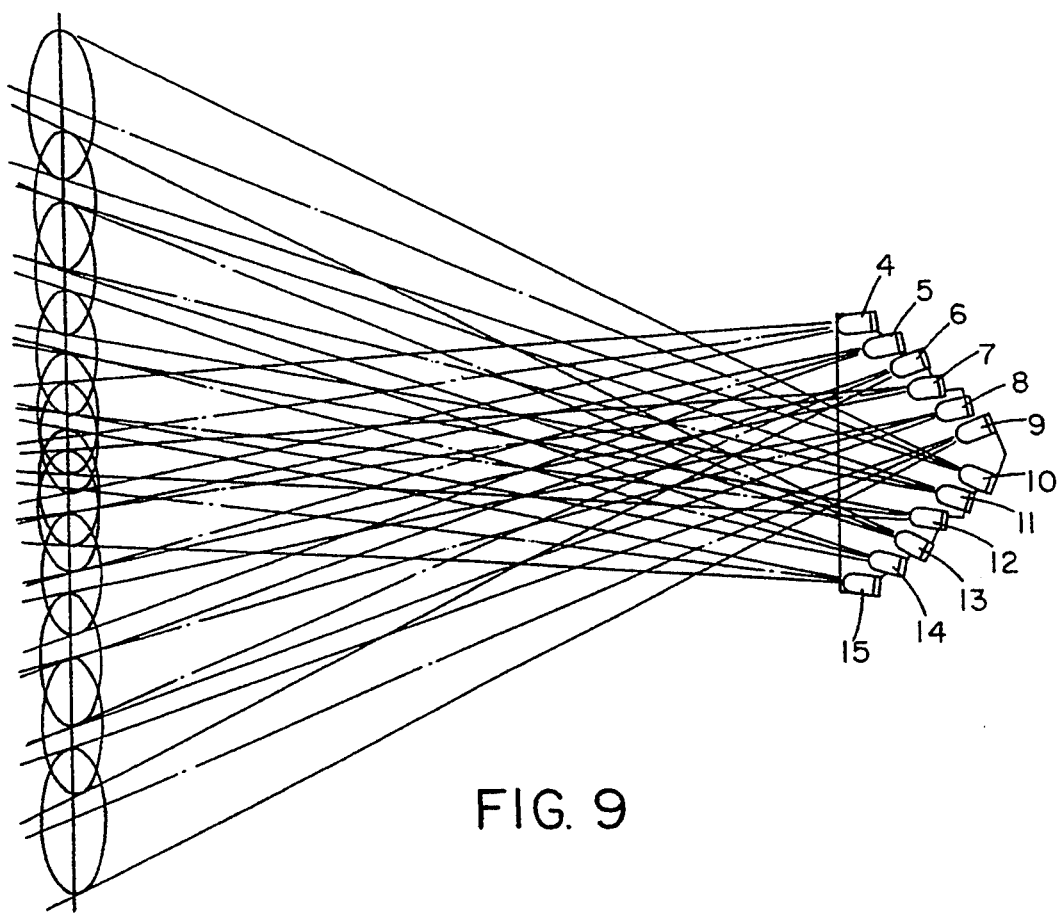
FIG. 9 is a diagrammatic view of an alternate LED layout and the corresponding light distribution.

The cylindrical lens 38 may be modified to provide a uniform distribution of light at the focal point. This "homogenization" is provided by knurling or scalloping the input side 90 of the lens, as shown in FIG. 14. Each step 92 in the knurled edge 90 acts as a "mini-lens" which spreads the light entering the cylindrical lens at that point. The spread light from each mini-lens overlaps other spread light to homogenize the light at the focal point of the cylindrical lens. The focal point of the cylindrical lens is determined by the outer side 94. Ideally, the placement of the cylindrical lens 38 with respect to the LEDs is determined by the point at which the LEDs combine to produce the most concentrated light. In FIG. 9, this point is along line 75.

Figure 14A:
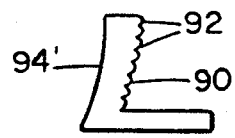
FIGS. 14a and 14b are diagrammatic views of a knurled cylindrical lens with a concave and convex output edge, respectively.
Figure 14B:

In conjunction with the knurled input edge, the output edge of the cylindrical lens can be either concave or convex. The concave edge 94' is shown in FIG. 14a, and the convex edge 94 is shown in FIG. 14b. The concave edge 94 is selected for scans of two-dimensional bar codes at distances from contact to 3 inches. The convex edge 94 is used for scan distances greater than 3 inches.

Figure 15:
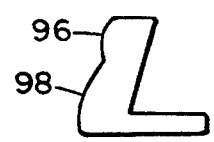
FIG. 15 is a diagrammatic view of a double radius cylindrical lens.
Figure 17:
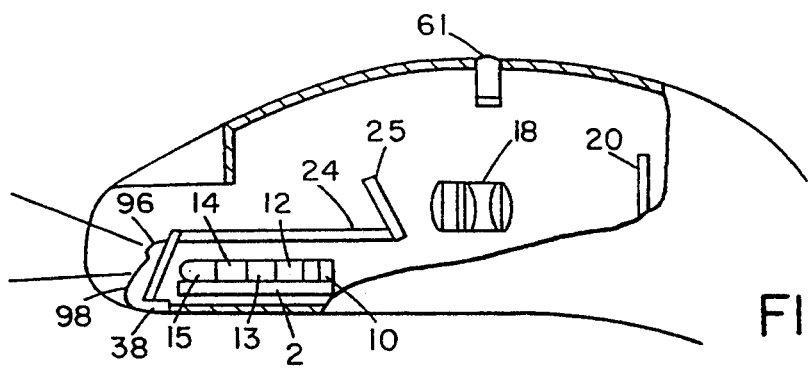
FIG. 17 a side elevation, partially cut away, of the invention utilizing the double radius cylindrical lens.

Another modification of the cylindrical lens is illustrated in FIG. 15. The double radius creates, in effect, two separate cylindrical sub-lenses 96 and 98, each with a different focal length. The light emitted by the LEDs will be focussed by both sub-lenses 96 and 98 so that two different lines of focussed light are created at different angles from the lens, as shown in FIG. 17. This lens provides greater variability in the distance at which a bar code can be accurately read without requiring a change in the cylindrical lens or a compromise in the strength of the signal.

Figure 16:
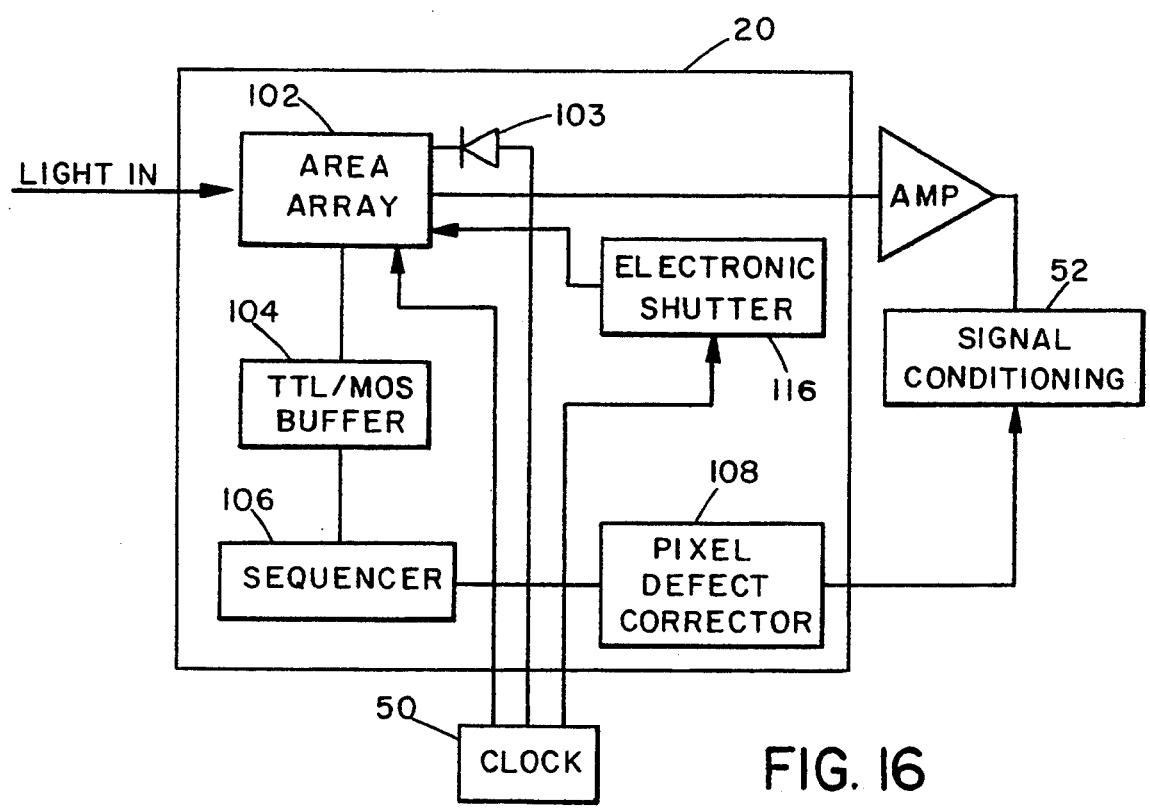
FIG. 16 lock diagram of the CCD module.

The detector module 20 consists of an array of charged coupled devices (CCD) which are arranged in equally spaced pixels, and may include additional processing elements which are shown in FIG. 16. The spacing of the pixels determines the limit of the resolution of the detector, so it is necessary to match the CCD resolution to the required spatial resolution in the image plane in which the detector lies. The magnification of the lens system should be chosen so that at least 2 CCD pixels cover the minimum bar width to be resolved in the image plane. This is especially important for bar codes printed with a dot matrix printer.

The arrangement of the CCD array will depend on the application. For a one-dimensional bar code, a single linear array of CCDs is acceptable. For two-dimensional bar codes, a single linear array can be used by moving the scanning head from the top to the bottom of the bar code. However, to provide better resolution, two parallel lines of CCDs, as illustrated in FIG. 3, or a full area array of CCDs can be used. The use of multiple rows of CCDs permits use of an auto-correction technique in which the signal read by one row of CCDs can be double-checked by a second row.

Portions of the double line CCD array or the area array can selectively turned on and off by connecting the CCD module controller to an external trigger or switch which has multiple selections. This will allow a one-dimensional bar code to be read by a two-dimensional scanner, while conserving power by using only as much of the CCD array as needed.

Three types of CCDs, which are known in the art, may be used for the area array of the two-dimensional bar code reader. The first type is the full frame CCD which has a single parallel register for photon exposure, charge integration and charge transport. A shutter is used to control the exposure and to block light from striking the CCD during readout.

The second type, the frame transfer CCD, has a parallel register which is composed of two CCDs that are arranged in tandem. One of these CCD registers is the storage array which is covered with an opaque mask and provides temporary storage for collected charge during readout. The other CCD register, the image array, is identical in capacity to the storage array and is used to collect the image. After the image array is exposed, the electronic image it generates is shifted into the storage array for readout. While the storage array is read, the image array can collect charge for the next image.

The third type of CCD is the interline transfer CCD. This CCD has a parallel register that is subdivided so that the opaque storage register lies between the columns of pixels. The electronic image accumulates in the exposed area of the parallel register. For readout, the entire image is shifted under the interline mask. The CCD shift register also lies below the interline masks. The readout occurs the same as in the frame transfer CCD.

The area array 102, which is included in the CCD module 20 illustrated in FIG. 16, operates in an interlaced mode. This mode consists of shifting the potential wells by one-half pixel in alternate fields, "fields" referring to the field of view of the scanning head. This shift is possible due to the multiple phase arrangement of gate structures in the CCD which allows sequential propagation of the collected charges in the potential wells, as is known in the art. This results in two successive fields containing different information, given a certain number of line images with reduced aliasing. During the exposure, or integration, period, charge is accumulated on each pixel in proportion to the incident illumination. Every line includes a certain number of pixels. A transfer pulse will "readout" the charge on each line to generate an analog signal. The combined readouts of each line represent the two-dimensional bar code. The information will be conditioned and stored in memory buffer 88 in order to be decoded by decoder 26. After the transfer has occurred, the area array 102 will return to its integration state to accumulate charge for the next field.

In order to obtain the optimum performance, a calibration of the dark levels and shading correction must be made. A dark frame is stored and subtracted from an image to yield a zero reference.

A shading correction frame, or flat field, is required to make correction for variations in system responsivity. Because the CCD has excellent linearity, only one flat field must be taken to correct an image anywhere within the available dynamic range at a specific wavelength (660 nm). Shading varies with wavelength, and flat fields are often obtained at many wavelengths. A calibration sequence requires taking the image of interest $I_R$, a dark frame, $I_D$, and a flat field, $I_F$. An arithmetic pixel-by-pixel computation yields a corrected image with photometric integrity $I_C=(I_R-I_D)/(I_F-I_D)$.

The drive clock sequencer and synchronization module 106 utilizes a single quartz crystal or external clock to provide all necessary logic and synchronization signals. A TTL/MOS buffer 104, as is known in the art, is included as an interface between the area array 102 and the sequencer module 106.

An anti-blooming device 103 may also be included in the detector module 20. The antiblooming device, which operates on each pixel, consists of a diode that is separated from the photo site by a potential barrier. This potential barrier is controlled by a dedicated gate, clocked by a clock gate control. As a result, the excess charges give rise to a very weak current, so that the efficiency of the anti-blooming device is virtually unlimited.

Other secondary effects that limit the overillumination resistance are: 1) smearing, due to the passage of each column pixel along the overilluminated element during the transfer of the image to the memory; and, 2) carrier diffusion in the substrate, which is linked to the probability of collecting an electron generated under one pixel in the neighboring well. Although this effect is hardly perceptible on a "soft" image, it becomes of significant importance when there is a strongly overilluminated zone, such as might occur when reading in sunlight.

A pixel defect corrector 108 is included in the CCD module to manage pixel defect correction. The pixel defect corrector operates in association with the memory buffer 88. It operates by replacing the signal of the defective pixel or pixels on a line with the signal produced by the last non-defective pixel. This data substitution is carried out through a sample and hold circuit with an inhibiting input, located downstream of the CCD output and before the video signal conditioning and/or processing.

The positions of the defective pixels are mapped in the memory buffer 88 in terms of their relative x,y coordinates. These are quantified by the number of lines in the CCD's memory zone and the number of lines of clock pulses at which the defects appear. Likewise, the first defective pixel is picked out relative to the frame synchronization pulse. Defective pixels may be picked out through one or two synchronization pulses and clock pulses.

Figure 8:
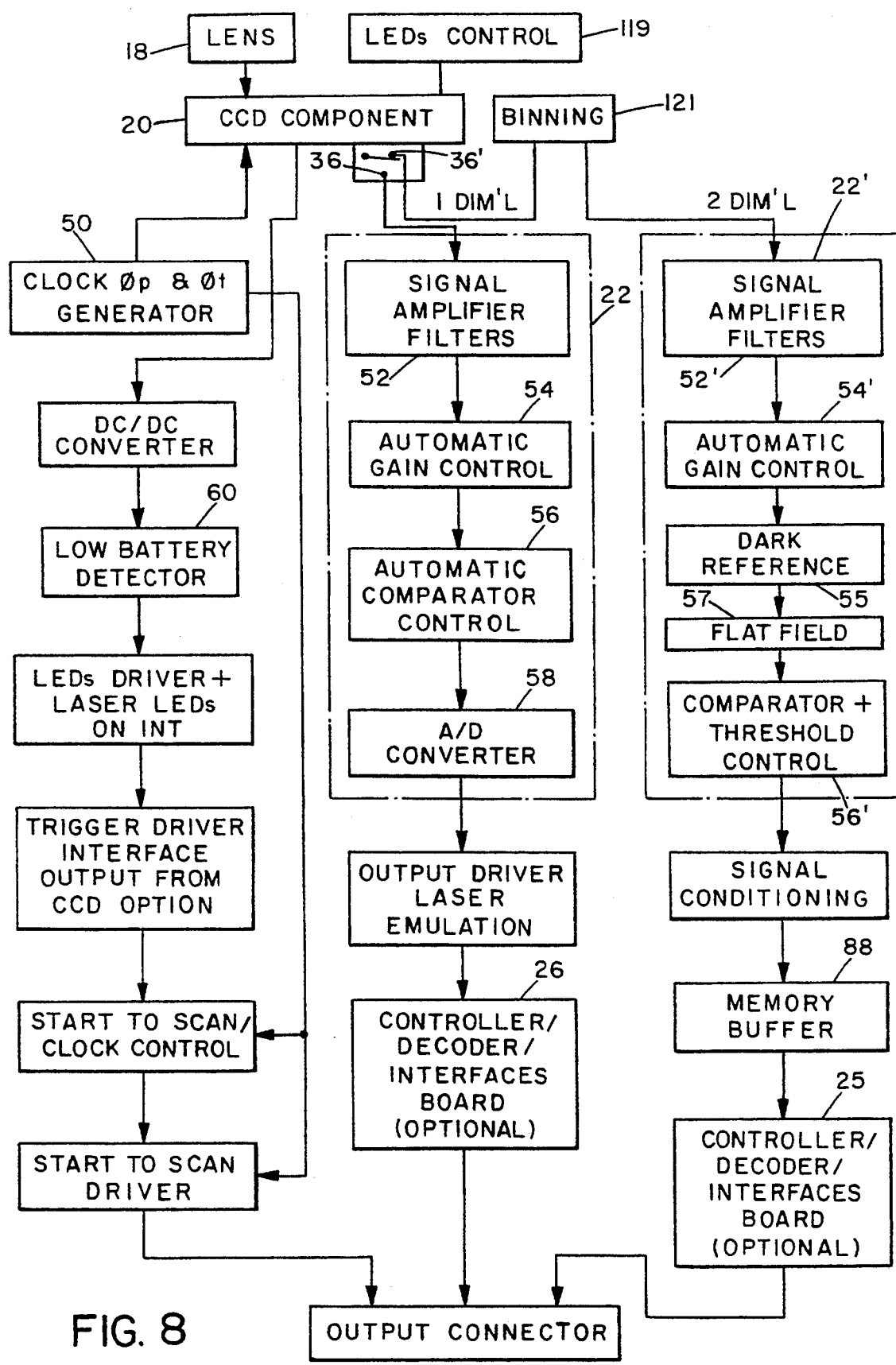
FIG. 8 is a block diagram of the operational sequence of the optical scanning head according to the present invention.

In the two-dimensional bar code application, the horizontal x-axis resolution is much more important than that of the y-axis. Therefore, CCD binning can be used in order to significantly increase the depth of field. Binning is the process of combining charge from adjacent pixels into "superpixels" at binning means 121 during readout as illustrated in FIG. 8. Binning improves the signal-to-noise ratio and allows the dynamic range of the CCD to be expanded at the expense of spatial resolution.

Electrical power is provided to the CCD array by D.C. source or battery 46. In a first embodiment of the invention, the supply of power to the CCD array is coordinated by a clocking signal with the sequential or graduated illumination of the LEDs. Specifically, as seen in FIG. 7e, a clock signal (from clock 50) is provided to the CCD array to clear it in coordination with the activation of the LEDs. The CCD array can be scanned at a variable rate, from 36 to 200 scans per second, with the rate being determined by the density of the bar codes being scanned. The scan rate is set by the system clock which then modifies the illumination sequence of the LEDs so that the coordination illustrated in FIGS. 7a–7e will be maintained. The determination of scan rate can be preprogrammed and can be initiated by scanning a bar code with the scanning rate set-up information, or other relevant information, prior to measurement of the bar codes of interest.

Figure 12:
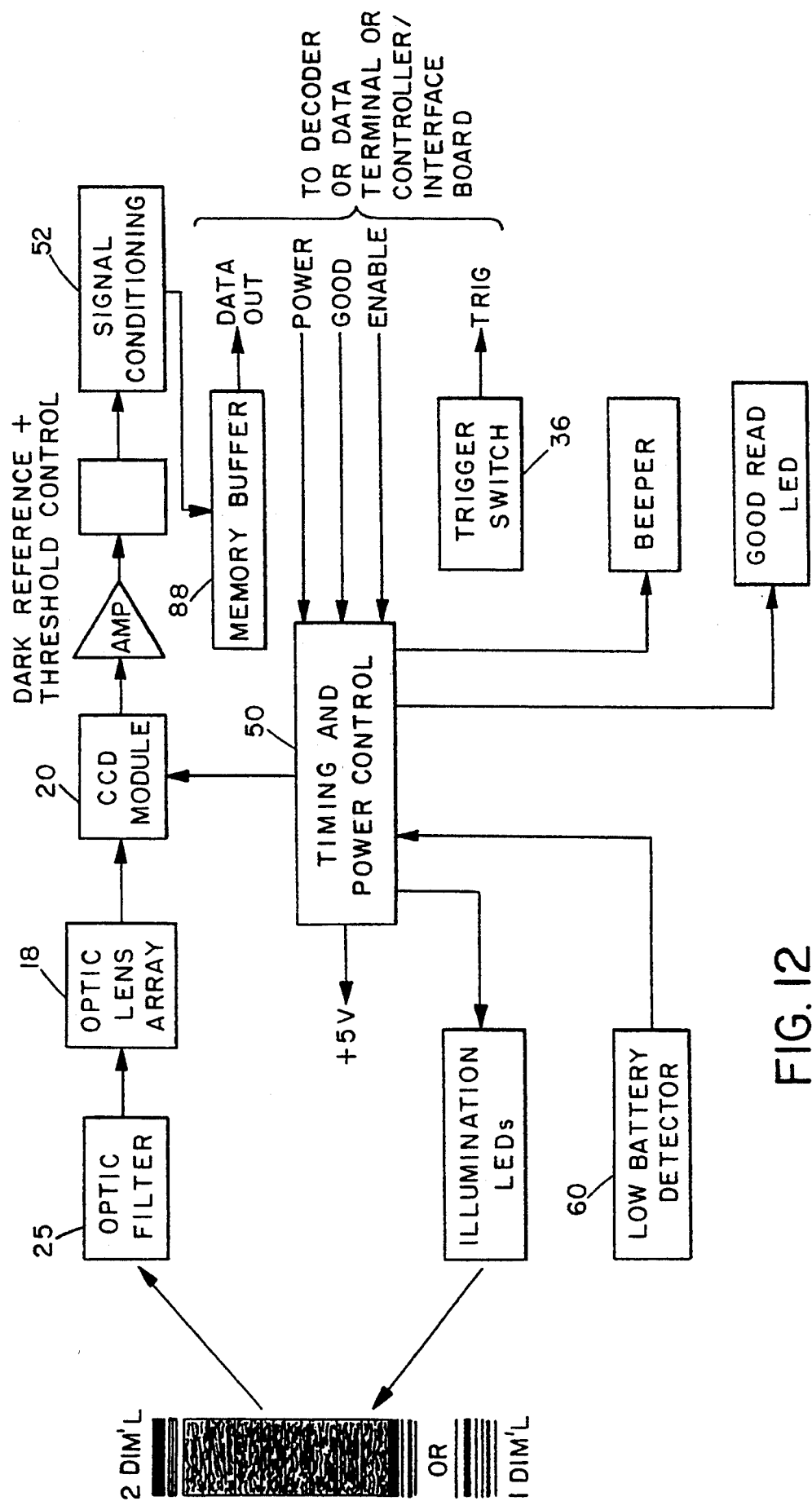
FIG. 12 is a block diagram of the scanning device.

The processing sequences are shown in FIGS. 8 and 12. For one-dimensional operation (following the first path in FIG. 8 by selecting the 1-dimensional path with duel trigger 36'), the signal provided by the CCD array will be amplified then processed through a low pass two pole filter and a high pass five pole filter (shown combined as filter 52) which will extract the useful signal any noise generated either by the incoming light or by the CCD array itself. An optional automatic gain control (AGC) 54 will adjust the level of the signal to a pre-determined level. The level of the signal entering the AGC is a function of the distance at which the bar code is scanned. The greater the distance that the scanner is held above the scanned code, the weaker the signal will be. A filtered signal will then provide a voltage to a circuit which determines the real time center point ("zero crossing") reference level to a comparator which will convert the analog video output signal to a digital signal representing the bar code. The use of an automatic comparator control (ACC) 56 will avoid noise generated by hysteresis and will avoid missing the white guard and the first commutation which represents the first bar in the video signal. The signal is then converted from analog to digital by A/D converter 58 and sent to decoder 26. (Decoder 26 is shown as "optional" because it can be combined with, or external to, the optical scanning head.)

Figure 21:
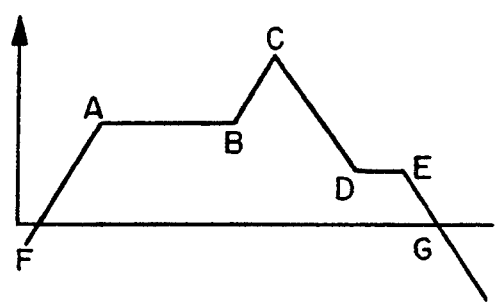
FIG. 21 is a plot of a filter transfer function.

In the two-dimensional scanner, the output of the CCD component is directed through signal converter 22' by selecting the 2-dimensional path with dual trigger 36'. Here the signal is amplified and filtered, as in the one-dimensional path, by filter 52'. Filter 52' may be a fixed or programmable multi-pole active amplifier filter. When a bar code is scanned, the waveform produced has a rounded form with a continuously varying component due to the crisp alternating black and white bars, with the amplitude being an indication of the pulse width. In order to magnify the amplitude according to the width of the bars and spaces, filter 52', which is a bandpass filter (active), will magnify the low amplitude portion of the signal and will maintain the high amplitude portion at the same level. The "transfer function" of filter 52' is shown in FIG. 21. The segments "BC" and "CD" indicate the magnification according to the high frequency (low level) or the small black and white bars to be magnified. The "AB" segment corresponds to the large black and white bars to be maintained at the same amplitude. The slopes of segments "FA", "C", "CD" or "EG" may be varied in order to adjust the relative magnitude of the narrow black and white barwidths with the wide bars. This filtering may be achieved by a fixed filter, an automatic filter, or by a programmable, menu driven function.

Gain control 54', which may be automatic, edge detection or highly adaptive thresholding (described below) is provided to adjust the magnitude of the received signal to a pre-determined level, regardless of the distance between the bar code and the scanner and the ambient illumination. (These techniques may also be used in the one-dimensional scanner.) As previously described, dark reference 55 and flat field 57 provide the means by which the calibration can be made to correct for variations in system responsivity by comparison with flat field 57. Comparator and threshold control 56' may include highly adaptive thresholding to recover the accurate form of the bar code signal with elimination of the convolution distortion.

Convolution distortion refers to the averaging of the signal due to the finite size of the CCD's resolution and the delays in the electronic circuits. The distortion results in a rounding of the slope of the signal, causing significant error. The adaptive thresholding method consists of following the slope of the signal and switching the digital output level of the final shape of the comparator into the one level on the rising slope of the analog signal and into the zero level on the descending slope of the analog signal, using the zero crossing of the analog signal (average value) as the reference level.

A video signal processing module, as is known in the art, may also be used to process the analog signal to provide a digital output data stream and/or to decode and provide a signal representing the decoded information within a two-dimensional bar code.

In an alternate embodiment, rather than sequentially illuminating the LEDs, the voltage to the LEDs is regulated in response to the signal level in the detector. The stronger the received signal, the lower the intensity of light required from the LEDs. The strength of the signal is dependent upon the distance between the scanner and the bar code, so, at the maximum scanning distance, the LEDs will receive full power. This conserves power by only demanding the power that is necessary. It also avoids saturating or distorting the detected signal if the bar code is read at a short distance from the scanner with high intensity light.

Figure 6:
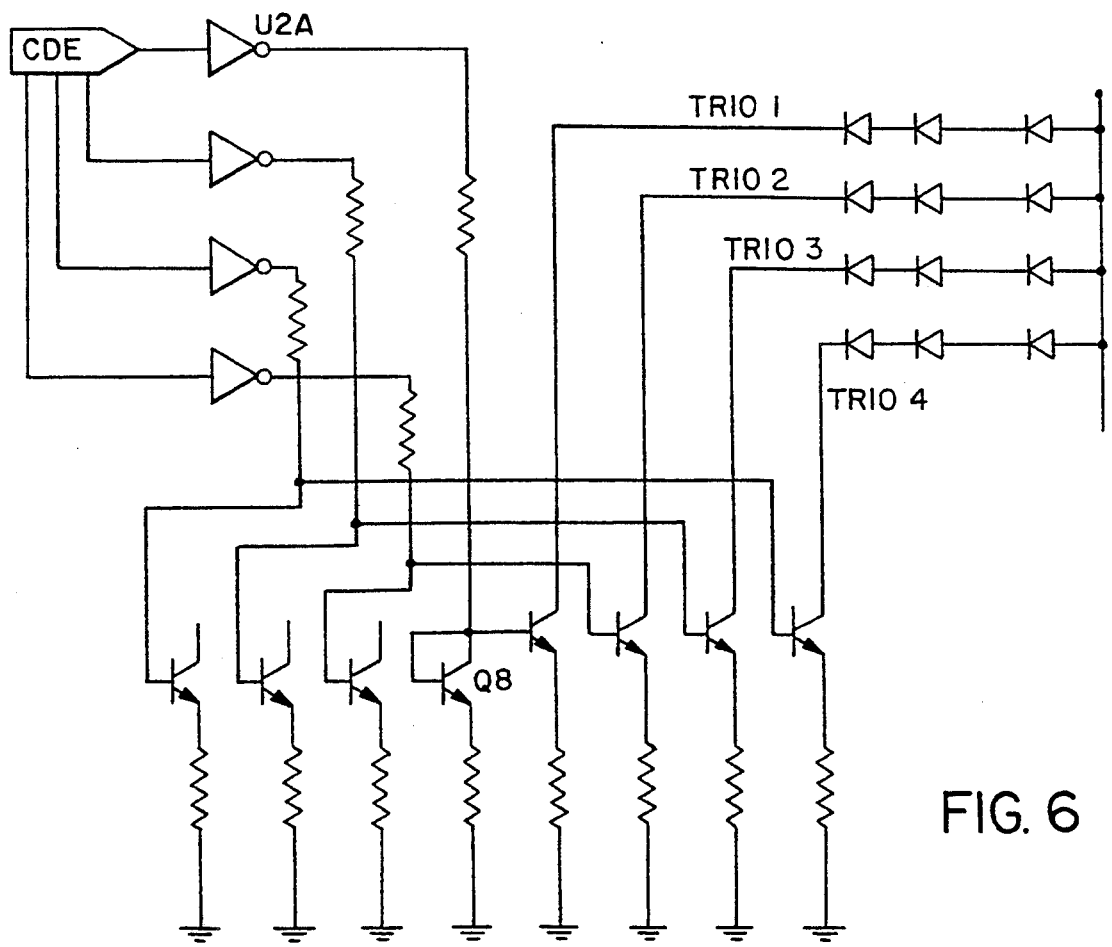
FIG. 6 is a circuit diagram of the LED board for the 12 LED configuration of FIG. 1.

The optical scanning head of the present invention provides for conservation of power supply energy by using a system clock to control a scanned, progressive illumination of the LEDs in coordination with clearing of the CCD array. The circuit diagram in FIG. 6 is provided to illustrate the sequential control of the four different LED trios which are illustrated in the embodiment of FIG. 1. For example, the clock driver provides a signal to activate amplifier U2A which then provides a signal to the first trio, identified as TRIO 1, to illuminate LEDs 5, 6 and 12. TRIO 1 is connected so that it will be on at all times that the scanner is activated, regardless of which other trios are on (note the base-collector short at transistor Q8).

FIG. 7 provides samples of pulse patterns for activation of the LEDs of the embodiment illustrated in FIG. 1. FIG. 7a illustrates the activation of the scanner at the beginning of a first clock pulse, i.e., the power is turned on. According to the pulse pattern illustrated in FIG. 7b upon application of the "turn on" signal, first trio of LEDs (TRIO 1) is illuminated. At the beginning of the second clock cycle a second trio (TRIO 2) is illuminated. Also at this time, a signal is provided to the CCD array to reset it to initiate its detection function, shown in FIG. 7e. At the beginning of the third clock cycle a third trio of LEDs (TRIO 3) turns on, and during a fourth clock cycle a fourth set of LEDs (TRIO 4) turns on. During the fifth clock cycle TRIO 2, TRIO 3 and TRIO 4 turn off and only TRIO 1 remains on. This step up/drop down sequence is continued until the trigger is turned off. In FIG. 7c a second possible pulse pattern is illustrated in which the first trio of LEDs turns on during the first clock cycle and a second LED trio turns on the second clock cycle, then turns off in the third clock cycle so that the first trio remains on until the seventh clock cycle when the second and third trios turn on for a single clock cycle. The first trio of LEDs remains on during the entire procedure and in the twelfth clock cycle, all four trios of LEDs turn on for one cycle. After a single clock cycle, where only the first set of LEDs remain on, the sequence repeats. In FIG. 7d the pulse pattern alternates between two trios of LEDs being on and turning on four trios of LEDs, with one trio being on at all times. For comparison of the inventive method to prior art practices, FIGS. 7f and 7g are provided. In FIG. 7f, a simple alternation occurs between on and off. In FIG. 7g, any combination of the LEDs remains on at all times that the trigger is activated.

In an alternate embodiment, power conservation is achieved by regulating the voltage supplied to the LEDs in response to the level of the signal generated by the detector array. As above, the detector signal level is dependent upon the distance at which the bar code is scanned. For greater distances, the signal level will be lower. In response to this lower signal, the voltage supplied to the LEDs will be increased. When the signal level is above a pre-determined limit, the voltage supplied to the LEDs will be less, since less light is needed to provide an acceptable signal. As an example, if the bar code is read at close range, the LEDs will be supplied with a 25% of the maximum current drain, which, in the prototype device, is 5 mA. If the bar code is read within the middle of the total field depth, the LEDs receive 50%, or 10 mA. At the outer limits of the field depth, the supplied current will be 20 mA. The percentage of power applied to the LEDs may change with the color of the bar code as needed to obtain the optimal light intensity for scanning. This power management technique will use the level of the video output signal to command and control the current on the LEDs through an appropriate clocking function.

The light path of the incident beam at the front region of the scanner will generate a beam of light through angular distance over a field of view across the bar code symbol located in the vicinity of the reference plane. The width of the light transmissive window 24 represents a limiting factor for the width of the incident beam. For this reason, the LEDs are mounted as close as possible to the window 24 to optimize the field of view and the incident beam power. Despite this limitation, the field of view of the incident beam is generally independent of the width of the PCB 2 or of the housing. This permits the field of view, i.e., the transverse beam dimension of the incident beam to be larger than the width of the window 24. This is due to the fact that the LEDs emit the incident beam at different directions from each side of the device within the scanning head. The LEDs are oriented to provide parallel beams in pairs. For example, a first pair of LEDs, LEDs 4 and 7 are oriented at a 7.5° angle on the y-axis (a line normal to the front of the PCB 2), 5 and 8 are oriented at 15°, and LEDs 6 and 7 are oriented at 22.5°, as illustrated in FIG. 9. The LEDs on the other leg of the "V" are similarly oriented in the opposite direction. As can be seen in the figure, the fan of light which results from this orientation provides an intensity distribution which is higher within a narrow region at the center of the fan, as determined at a distance of 7 inches from the scanner.

Figure 10:
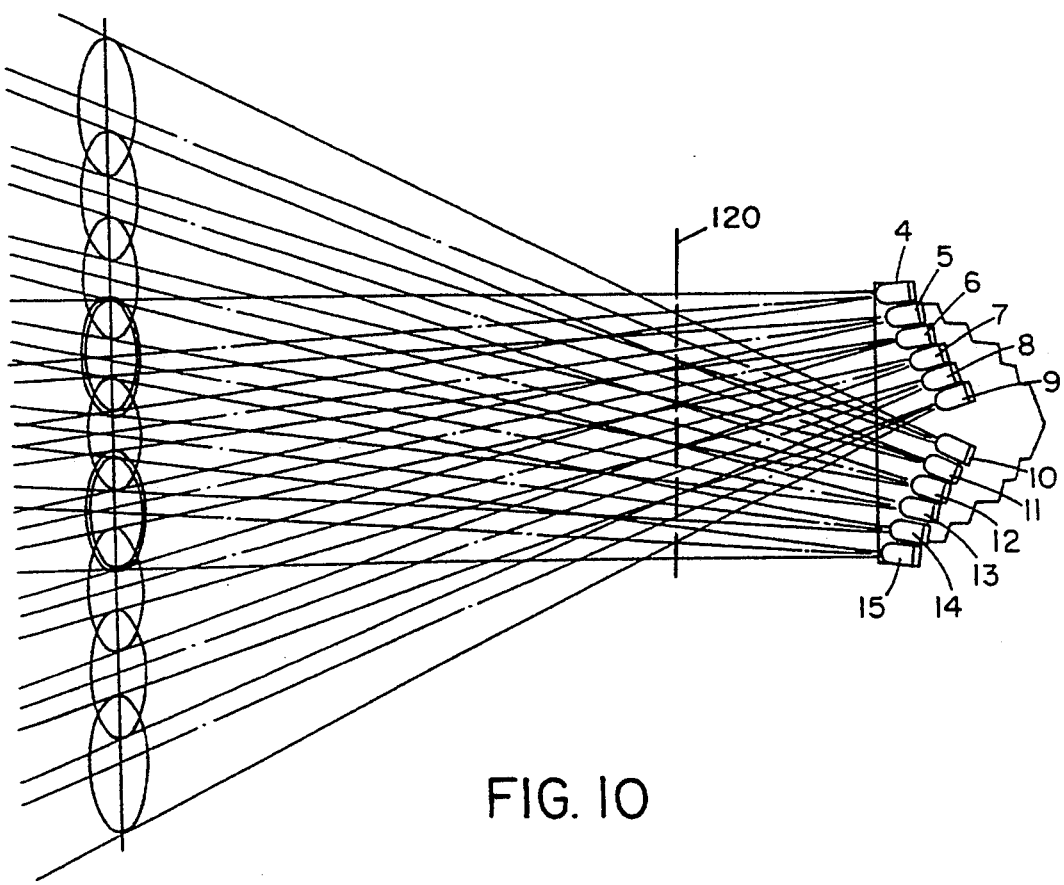
FIG. 10 is a diagrammatic view of a second alternate LED layout and its corresponding light distribution.

The alternate LED arrangement shown in FIG. 10 places the centermost LEDs at an angle of 3.75 degrees from a line normal to the front of the scanner, with the other LEDs being oriented at 3.75 degree increments as they progress outward along the legs of the "V". This LED configuration results in a slightly wider region of higher intensity as compared to the above-described embodiment. It should be noted that the cylindrical lens 38 should be positioned at a distance from the LEDs corresponding to the location where the beams cross to provide the highest intensity, e.g., location 120 in FIG. 10.

A third configuration of the LEDs is illustrated in FIG. 11, which shows a line of LEDs at varying orientations. This configuration is described above.

Other electrical sub circuits can also be provided on PCB 2, including the analog filter 50 and A/D converter 52. However, in order to configure the housing of the scanner in desired position, it may be necessary to provide a second circuit board oriented at some angle to the first circuit board onto which additional subcircuits can be placed including a decoder chip and a memory device. For example, two or more circuit boards can be configured so that one abuts another at approximate right angles to create an "L"-shaped or "U"-shaped arrangement. This arrangement would allow placement of one of the boards in the barrel of a scanning gun with the other board extending partially into the handle portion.

The decoder module 26 may be either inside or outside of the scanning head housing and will process the digitalized signal generated in the scanning head to calculate the desired data, e.g., the multiple digit representation or code represented by the bar code symbol in accordance with the algorithm contained in the software program. The decoder module includes a random access memory (RAM) for temporary data storage, and EPROM or PAL for holding the control program and a microprocessor which controls the RAM and EPROM or PAL. The decoder module will also include circuitry for controlling the scanning head and the communication circuitry for communication with different functions of the scanning head or with a host system to which the scanning head can be connected, such as a hand held terminal data screen personal computer for computer network.

A low battery detector 60 with indicator LED 61 is included in the housing to provide an indication of insufficient power for further scans. This will provide advance warning so that the user will be aware of the problem before having scanned a number of items without realizing that the items cannot register properly due to the insufficient power.

An electronic shutter 116, shown in FIG. 16, is activated by the clock signal from clock 50 to periodically prevent the integration of charge from the light impinging upon the detector 20. This creates "snapshots" of the bar code image to preserve the integrity of the bar code pattern signal as one of the scanning head and the bar code is in motion with respect to the other.

The circuitry, with or without the power supply of a portable configuration, of the optical scanner is protected within a housing 30 which is contoured to easily fit into the user's hand. The user will grip the housing 30 by its handle portion 32, illustrated in FIGS. 4 and 5, with the window portion 34 aimed at the bar code symbol to be read. The trigger 36 is built within the handle 32 for easy, one-handed operation of the scanner, with the trigger being positioned at a short distance from the user's fingers so that activation is simply a matter of depressing the trigger. A dual trigger 36, multi-position trigger or additional switch, is provided for selecting between one-dimensional and two-dimensional scanning, so that only as much power is used as is necessary to assure a high quality signal. The window portion can be placed anywhere from 0 to 22 inches above or in front of the bar code to be scanned. With a scanning distance of less than seven inches, it is desirable to center the fan of light over the bar code since different intensities due to the sequential limitation of the LEDs may illuminate some portions of the bar code more brightly than others, and due to the higher density of light at the center of the fan. For scans greater than 22 inches, the LEDs can be replaced with a flash lamp.

The optical scanning head of the present invention provides a device for building a small or self-contained portable device, a portable component of a multi-component scanner, or the optical portion of a built-in scanning unit, for bar code scanning which uses LED and CCD technology making it an economical device. The scanning head is capable of reading bar codes up to 22 inches away from the detector with LED illumination and even more with a flash lamp, so that it is versatile for either portable or fixed implementation. The variably pulsed activation of the LEDs and CCD array, or the graduated illumination of the LEDs, makes the device capable of operating at low power with minimal power drain during illumination, a significant factor in portable scanners. The lens system and fan of light produced by the LED array permit the reading of wide range of bar code densities and widths. For point-of-sale use, or industrial applications, where the scanner is fixed and the object imprinted with the bar code is moved past it, a number of optical scanning heads of the present invention can be used in combination and mounted at different angles so that, regardless of the orientation or position of the bar code, the bar code can be read. For example, a crossed or starburst pattern can be made by combining two or four scanning heads, respectively. The signal generated by each individual scanning head will be compared with signals from the other scanning heads, and the signal with the least error will be used. The signals from each scanning head may also be used to double check the signals provided by other scanning heads.

Another combination into which the optical scanning head of the present invention can be incorporated is in a "touchless" bar code "tunnel", which consists of mounting on each side of a rectangular pass-through tunnel with one or more scanning heads built into each wall of the tunnel, i.e., the top and two sides. The tunnel may be, but is not necessarily, included in a conveyer belt system used in point-of-sale or industrial applications. The result is that, regardless of the position or the side of the object on which the bar code is printed, at least one of the optical scanners will be able to read the bar code, either one- or two-dimensional, automatically and transmit the decoded data to the computer or cash register. This method will simplify handling and will reduce "check-out" time of the items. Such a capability would be highly advantageous in a grocery check-out situation.

It will be evident that there are additional embodiments which are not illustrated above but which are clearly within the scope and spirit of the present invention. The above description and drawings are therefore intended to be exemplary only and the scope of the invention is to be limited solely by the appended claims.

I claim:

1. An optical scanning device for scanning one- and two-dimensional bar codes comprising:

a printed circuit board having a front and a rear;

an LED array having a plurality of LEDs disposed near said front of said printed circuit board wherein each LED of said plurality is oriented to emit light at an angle different than other LEDs of said plurality, said angle of each LED being a non-zero angle with respect to a reference line perpendicular to said front of said circuit board, said LED array projecting a fan of light forward in a direction along said reference line;

a cylindrical lens forward of said LED array having and input edge and an output edge for focussing said fan of light into a line of light at its focal distance for illuminating a bar code within a field of view within a range of said focal distance so that reflected light is reflected therefrom;

a detector comprising at least one linear CCD array disposed near rearward of said LED array on said printed circuit board for detecting a portion of reflected light from said bar code and generating an electrical signal in response thereto wherein said electrical signal is an analog representation of said bar code;

an optical assembly for receiving said reflected light and directing said reflecting light onto said detector;

a conversion assembly for converting said electrical signal into a signal corresponding to said bar code; and a voltage source for providing a driving voltage to said LED array, said CCD detector and said conversion assembly.

2. An optical scanning device as in claim 1 wherein said LED array is arranged in a "V"-shape.

3. An optical scanning device as in claim 1 wherein said LED array is arranged in a generally linear fashion.

4. An optical scanning device as in claim 1 wherein said LED array is arranged in two discrete rows of LEDs.

5. An optical scanning device as in claim 4 wherein said two discrete rows are each parallel to said front of said printed circuit board.

6. An optical scanning device as in claim 4 wherein said two discrete rows are substantially perpendicular to said front of said printed circuit board.

7. An optical scanning device as in claim 1 wherein said LED array is arranged in a vertical plane perpendicular to said printed circuit board.

8. An optical scanning device as in claim 1 wherein said LED array comprises at least two groupings of LEDS, each grouping having an equal number of LEDs, and further comprising:

a clocking device for controlling a transfer of driving voltage from said voltage source to each grouping of LEDs wherein a first grouping of LEDs remains on and at least one second grouping of LEDs is periodically turned on and off according to a clocking signal generated by said clocking device.

9. An optical scanning device as in claim 8 wherein said clocking device further controls a timing of scanning by said CCD detector and transfer of said electrical signal from said CCD detector to said conversion assembly.

10. An optical scanning device as in claim 1 further comprising:

a clocking device for controlling transfer of driving voltage from said voltage source to said at least one grouping of LEDs; and a gain controller responsive to a level of said electrical signal for controlling a level of driving voltage applied to said at least one grouping of LEDs.

11. An optical scanning device as in claim 10 wherein said gain controller ramps up said level of said driving voltage when said optical scanning device is at a greater distance from said bar code.

12. An optical scanning device as in claim 1 wherein said field of view has a depth in the range of 0 to 22 inches.

13. An optical scanning device as in claim 1 wherein said input edge of said cylindrical lens has a knurled surface.

14. An optical scanning device as in claim 13 wherein said output edge of said cylindrical lens is concave.

15. An optical scanning device as in claim 13 wherein said output edge of said cylindrical lens is convex.

16. An optical scanning device as in claim 1 wherein said output edge of said cylindrical lens has a double radius wherein a first portion of said output edge has a first focal length and a second portion of said output edge has a second focal length different from said first focal length.

17. An optical scanning device as in claim 1 wherein said detector comprises two parallel linear CCD arrays.

18. An optical scanning device as in claim 1 wherein said detector comprises an area array of CCDs.

19. An optical scanning device as in claim 1 wherein said optical assembly comprises a plurality of lenses and filters for collecting and optimizing said reflected light for detection by said detector.

20. An optical scanning device as in claim 19 wherein said optical assembly further comprises a spatial filter having at least one air slit.

21. An optical scanning device as in claim 20 wherein said spatial filter has two crossed slits.

22. An optical scanning device as in claim 1 wherein said conversion assembly includes an automatic gain control for amplifying said electrical signal when a level of said electrical signal falls below a pre-determined level.

23. An optical scanning device as in claim 1 wherein said conversion assembly includes an automatic comparator control.

24. An optical scanning device as in claim 1 further comprising a light shield for blocking stray light from said optical assembly.

25. An optical scanning device as in claim 1 wherein a housing retains components of said optical scanning device, said housing having a configuration to be held in a user's hand so that said fan of light is directed towards said bar code.

26. An optical scanning device as in claim 1 wherein said conversion assembly includes an analog-to-digital converter and an microprocessor for manipulating said electrical signal.

27. An optical scanning device as in claim 1 further comprising an electronic shutter for periodically blocking light from impinging upon said detector when one of said optical scanning device and said bar code is in motion with respect to the other.

28. An optical scanning device as in claim 1 further comprising a memory buffer for storing an electronic image of a two-dimensional bar code.

29. An optical scanning device as in claim 1 further comprising a signal converter having a dark reference for calibration of said electrical signal.

30. An optical scanning device as in claim 29 further comprising a flat field for comparison with said dark reference to provide shading correction.

31. An optical scanning device as in claim 1 wherein said CCD detector includes an anti-blooming device to decrease excess charges caused by overillumination.

32. An optical scanning device as in claim 1 wherein said CCD detector includes a pixel defect corrector.

33. An optical scanning device as in claim 1 wherein said CCD detector includes a binning means for enhancing a depth of field of said optical scanning device.

34. An optical scanning device as in claim 1 wherein said conversion assembly includes a gain control means for controlling an amplitude of said electrical signal.

35. An optical scanning device as in claim 1 wherein said conversion assembly includes means for highly adaptive thresholding.

36. An optical scanning device as in claim 1 wherein said conversion assembly includes a multi-pole active filter.

37. An optical scanner for reading and decoding information encoded in one-dimensional and/or two-dimensional bar codes comprising alternating lines of light and dark, said optical scanner comprising:
a printed circuit board having a front, a center and a rear;
an array of light emitting diodes comprising at least one combination of light emitting diodes disposed near said front of said printed circuit board in an arrangement wherein each light emitting diode of said at least one combination emits light at an angle different from other light emitting diodes of said at least one combination so that a fan of light is projected from said array along a line perpendicular to said front of said printed circuit board;
a cylindrical lens having an input edge and an output edge disposed forward of said array of light emitting diodes for focussing said fan of light into a line of light at its focal distance onto a reference plane within a field of view containing said bar code so that light is reflected therefrom;
an optical assembly disposed at a center of said printed circuit board for receiving, concentrating and directing reflected light toward said rear of said board;
a CCD array disposed at said rear of said printed circuit board for detecting a portion of said reflected light directed thereon by said optical assembly and generating an analog representation of said bar code;
a conversion assembly for receiving and converting said analog representation into an electrical signal corresponding to said bar code; and
a voltage source for providing a driving voltage to said array of light emitting diodes, said CCD array and said conversion assembly.

38. An optical scanner as in claim 37 wherein said array of light emitting diodes comprises at least two combinations of light emitting diodes and further comprising:
a clocking device for controlling a transfer of driving voltage from said voltage source to each combination of light emitting diodes wherein a first said combination remains on when said optical scanner is activated and at least one second said combination is periodically turned on and off according to a clocking signal generated by said clocking device.

39. An optical scanner as in claim 38 wherein said clocking device further controls a timing of scanning of said CCD array and a transfer of said analog representation to said conversion assembly.

40. An optical scanner as in claim 37 further comprising:
a clocking device for controlling transfer of driving voltage from said voltage source to said at least one combination of light emitting diodes; and
a gain controller responsive to a level of said electrical signal for controlling a level of driving voltage applied to said at least one combination of light emitting diodes.

41. An optical scanner device as in claim 40 wherein said gain controller ramps up said level of said driving voltage when said optical scanner is at a greater distance from said bar code.

42. An optical scanner as in claim 37 wherein said field of view has a depth in the range of 0 to 22 inches.

43. An optical scanning device as in claim 37 wherein said input edge of said cylindrical lens has a knurled surface.

44. An optical scanning device as in claim 43 wherein said output edge of said cylindrical lens is concave.

45. An optical scanning device as in claim 43 wherein said output edge of said cylindrical lens is convex.

46. An optical scanning device as in claim 37 wherein said output edge of said cylindrical lens has a double radius wherein a first portion of said output edge has a first focal length and a second portion of said output edge has a second focal length different from said first focal length.

47. An optical scanning device as in claim 37 wherein said CCD array comprises two parallel rows of CCDs.

48. An optical scanning device as in claim 37 wherein said CCD array comprises an area array of CCDs.

49. An optical scanner as in claim 37 wherein said array of light emitting diode is disposed in a generally V-shaped arrangement.

50. An optical scanner as in claim 37 wherein said array of light emitting diodes is disposed in at least one generally straight row across said front of said printed circuit board.

51. An optical scanner as in claim 37 wherein said array of light emitting diodes is disposed in two rows perpendicular to said front of said printed circuit board.

52. An optical scanner as in claim 37 wherein said optical assembly comprises a plurality of lenses and filters for optimizing said reflected light for detection by said CCD array.

53. An optical scanner as in claim 52 wherein said optical assembly includes a bandpass filter for blocking light having a wavelength outside of a range around a predetermined wavelength at which said array of light emitting diodes emits.

54. An optical scanner as in claim 37 wherein each light emitting diode of said array emits visible red light.

55. An optical scanner as in claim 54 wherein said visible red light has a wavelength of 660 nanometers.

56. An optical scanner as in claim 37 wherein each light emitting diode of said array emits infrared light.

57. An optical scanner as in claim 37 wherein said conversion assembly includes an automatic gain control for controlling gain in response to a detected intensity level of said reflected light.

58. An optical scanner as in claim 37 wherein said optical assembly further comprises a light shield to block out stray light.

59. An optical scanner as in claim 37 wherein said optical assembly is slidable in a direction running from said front to said rear of said printed circuit board to permit variation in a depth of field of said optical scanner.

60. An optical scanner as in claim 37 wherein said CCD array has a density of elements selected according to a density of said alternating lines of said bar code.

61. An optical scanner as in claim 37 wherein said fan of light has an intensity distribution which is denser at a center of said fan.

62. An optical scanner as in claim 37 further comprising a housing for hand-held operation.

63. An optical scanner as in claim 37 further comprising a trigger for activating and de-activating said optical scanner.

64. An optical scanner as in claim 63 wherein said trigger comprises a dual trigger for selecting one-dimensional or two-dimensional scanning.

65. An optical scanner as in claim 37 wherein said conversion assembly includes a memory buffer for storing an electronic image of a two-dimensional bar code.

66. An optical scanner as in claim 37 wherein said conversion assembly includes a dark reference for calibration of said electrical signal.

67. An optical scanner as in claim 66 further comprising a flat field for comparison with said dark reference to provide shading correction.

68. An optical scanner as in claim 37 wherein said conversion assembly includes an anti-blooming device to decrease excess charges in said CCD array caused by overillumination.

69. An optical scanner as in claim 37 wherein said conversion assembly includes a pixel defect corrector.

70. An optical scanner as in claim 37 wherein said conversion assembly includes a binning means for enhancing a depth of field of said optical scanning head.

71. An optical scanner as in claim 37 wherein said conversion assembly includes a gain control means for controlling an amplitude of said electrical signal.

72. An optical scanner as in claim 37 further comprising a signal conditioning means having highly adaptive thresholding.

73. An optical scanning head as in claim 37 wherein said conversion assembly includes a multi-pole active filter.

74. An optical scanning head for inclusion in a bar code scanning system for scanning one-dimensional and two-dimensional bar codes comprising:

a printed circuit board having a front, a center and a rear portion;

an LED array disposed at said front portion of said printed circuit board for projecting a reference fan of light, each LED of said array being oriented to emit light at an angle different from other LEDs in said array;

a cylindrical lens having an input edge and an output edge for focussing said reference fan of light at its focal distance for illuminating a bar code within a field of view to be read so that light is reflected therefrom;

a CCD module disposed rearward on said printed circuit board having a CCD array for detecting a portion of reflected light from said bar code and generating an electrical signal in response thereto wherein said electrical signal is an analog representation of said bar code; and an optical assembly for receiving said reflected light and directing said reflecting light onto said CCD module.

75. An optical scanning head as in claim 74 wherein said LED array is disposed in a generally V-shaped arrangement.

76. An optical scanning head as in claim 74 wherein said LED array is disposed in at least one generally linear arrangement.

77. An optical scanning head as in claim 76 wherein said LED array comprises two parallel linear arrangements parallel to said front of said printed circuit board.

78. An optical scanning head as in claim 76 wherein said LED array comprises two parallel linear arrangements perpendicular to said front of said printed circuit board.

79. An optical scanning head as in claim 74 wherein said optical assembly comprises a plurality of lenses and filters for collecting and optimizing said reflected light for detection by said CCD module.

80. An optical scanning head as in claim 74 wherein said input edge of said cylindrical lens has a knurled surface.

81. An optical scanning head as in claim 74 wherein said output edge of said cylindrical lens is concave.

82. An optical scanning head as in claim 74 wherein said output edge of said cylindrical lens is convex.

83. An optical scanning head as in claim 74 wherein said output edge of said cylindrical lens has a first radius and a second radius, each having a different focal length.

84. An optical scanning head as in claim 74 further comprising a light shield for blocking stray light from said optical assembly.

85. An optical scanning head as in claim 74 further comprising means for combining said optical scanning head with other optical scanning heads so that a bar code can be read at a number of different orientations.

86. An optical scanning head as in claim 74 further comprising an electronic shutter for periodically preventing charge from collecting in said CCD module when one of said optical scanning device and said bar code is in motion with respect to the other.

87. An optical scanning head as in claim 74 further comprising a memory buffer for storing an electronic image of a two-dimensional bar code.

88. An optical scanning head as in claim 74 further comprising a signal converter having a dark reference for calibration of said electrical signal.

89. An optical scanning head as in claim 88 further comprising a flat field for comparison with said dark reference to provide shading correction, 90. An optical scanning head as in claim 74 wherein said CCD module includes an anti-blooming device to decrease excess charges caused by overillumination.

91. An optical scanning head as in claim 74 wherein said CCD module includes a pixel defect corrector, 92. An optical scanning head as in claim 74 wherein said CCD module includes a binning means for enhancing a depth of field of said optical scanning head.

93. An optical scanning head as in claim 74 wherein said CCD module includes a gain control means for controlling an amplitude of said electrical signal.

94. An optical scanning head as in claim 74 further comprising a signal conditioning means having highly adaptive thresholding,

95. An optical scanning head as in claim 74 further comprising a signal converter having a multi-pole active filter.

96. An optical scanning head as in claim 79 wherein said optical assembly further comprises a spatial filter having at least one air slit.

97. An optical scanning head as in claim 79 wherein said spatial filter has two crossed slits.

* * * * *